United States Patent
Hiyama et al.

(10) Patent No.: US 9,077,918 B2
(45) Date of Patent: Jul. 7, 2015

(54) PHOTOELECTRIC CONVERSION APPARATUS WITH FIRST AND SECOND CONDUCTORS THAT RESPECTIVELY SUPPLY CORRESPONDING VOLTAGES TO DIGITAL CIRCUITS OF A VERTICAL SCANNING CIRCUIT AND SIGNAL PROCESSING UNIT

(75) Inventors: Hiroki Hiyama, Sagamihara (JP);
Tetsuya Itano, Sagamihara (JP);
Kazuhiro Saito, Tokyo (JP); Kohichi Nakamura, Kawasaki (JP); Yu Maehashi, Kawasaki (JP); Koichiro Iwata, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 243 days.

(21) Appl. No.: 13/612,443

(22) Filed: Sep. 12, 2012

(65) Prior Publication Data
US 2013/0087687 A1    Apr. 11, 2013

(30) Foreign Application Priority Data
Oct. 7, 2011   (JP) .................................. 2011-223297

(51) Int. Cl.
*H01L 27/146* (2006.01)
*H04N 5/357* (2011.01)
*H04N 5/374* (2011.01)

(52) U.S. Cl.
CPC .......... *H04N 5/357* (2013.01); *H01L 27/14603* (2013.01); *H04N 5/3742* (2013.01)

(58) Field of Classification Search
CPC ................... H04N 5/335; H04N 5/357–5/3675
USPC ................. 250/214 R, 208.1, 214.1, 214 DC;
348/292–311; 257/209–292, 440;
327/104
See application file for complete search history.

(56) References Cited

U.S. PATENT DOCUMENTS 6,960,751 B2 * 11/2005 Hiyama et al. ............. 250/208.1
2010/0110216 A1 * 5/2010 Nishihara .................. 348/222.1

FOREIGN PATENT DOCUMENTS

JP            05-095099 A         4/1993

* cited by examiner

*Primary Examiner* — Georgia Y Epps
*Assistant Examiner* — Carolynn A Moore
(74) *Attorney, Agent, or Firm* — Canon USA Inc IP Division

(57) ABSTRACT

A photoelectric conversion apparatus includes, on one substrate, a pixel driving unit and a signal processing unit that includes a digital circuit configured to execute signal processing. A first voltage and a second voltage different in value from the first voltage are supplied to the digital circuit of the pixel driving unit. A third voltage and a fourth voltage different in value from the third voltage are supplied to the digital circuit of the signal processing unit. A main portion of a first conductor that supplies the first voltage to the digital circuit of the pixel driving unit and a main portion of a second conductor that supplies the third voltage to the digital circuit of the signal processing unit are isolated from each other.

24 Claims, 12 Drawing Sheets

PHOTOELECTRIC CONVERSION APPARATUS WITH FIRST AND SECOND CONDUCTORS THAT RESPECTIVELY SUPPLY CORRESPONDING VOLTAGES TO DIGITAL CIRCUITS OF A VERTICAL SCANNING CIRCUIT AND SIGNAL PROCESSING UNIT

BACKGROUND OF THE INVENTION

1. Field of the Invention

The present disclosure relates to a photoelectric conversion apparatus used for a scanner, a video camera, or a digital still camera.

2. Description of the Related Art

There has been offered an imaging apparatus that includes an analog/digital (A/D) conversion circuit and outputs a photoelectrically converted analog signal as a digital signal. Japanese Patent Application Laid-Open No. 05-095099 discusses an example photoelectric conversion apparatus. The photoelectric conversion apparatus prevents incursion of noise generated at a digital circuit unit into an analog circuit unit by separating a power source for the analog circuit unit from that for the digital circuit unit.

However, the conventional photoelectric conversion apparatus discussed in Japanese Patent Application Laid-Open No. 05-095099 has the following problems. Digital circuits used for the photoelectric conversion apparatus discussed in Japanese Patent Application Laid-Open No. 05-095099 include at least a digital circuit included in the A/D conversion circuit, a digital circuit for signal processing, and a digital circuit for pixel driving.

However, in the photoelectric conversion apparatus discussed in Japanese Patent Application Laid-Open No. 05-095099, a new problem such as the incursion of noise via the power or the ground among these different digital circuits, has not been found.

For example, in a pixel driving unit or the digital circuit included in the A/D conversion circuit, there is a period where many switches are simultaneously turned ON or OFF. In this case, large noise may enter the power source for the digital circuit or the ground, causing an erroneous operation of a signal processing unit operated at a relatively high speed corresponding to a signal output rate. This noise may be observed as random noise generated at a specific position in an image.

SUMMARY OF THE INVENTION

According to an aspect of the present disclosure, a photoelectric conversion apparatus arranged on one semiconductor substrate thereof, includes a plurality of pixels, a pixel driving unit that includes a digital circuit configured to supply a driving signal to the plurality of pixels, a plurality of A/D conversion circuits configured to convert analog signals from the pixels into digital signals, and a signal processing unit that includes a digital circuit configured to sequentially receive the digital signals from the plurality of A/D conversion circuits and execute signal processing, wherein a first voltage and a second voltage different in value from the first voltage are supplied to the digital circuit of the pixel driving unit, a third voltage and a fourth voltage different in value from the third voltage are supplied to the digital circuit of the signal processing unit, and a main portion of a first conductor that supplies the first voltage to the digital circuit of the pixel driving unit and a main portion of a second conductor that supplies the third voltage to the digital circuit of the signal processing unit, wherein the main portion of the first conductor and the main portion of the second conductor are isolated from each other.

Further features and aspects of the present disclosure will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the disclosure and, together with the description, serve to explain the principles disclosed herein.

DESCRIPTION OF THE EMBODIMENTS

Figure 1:
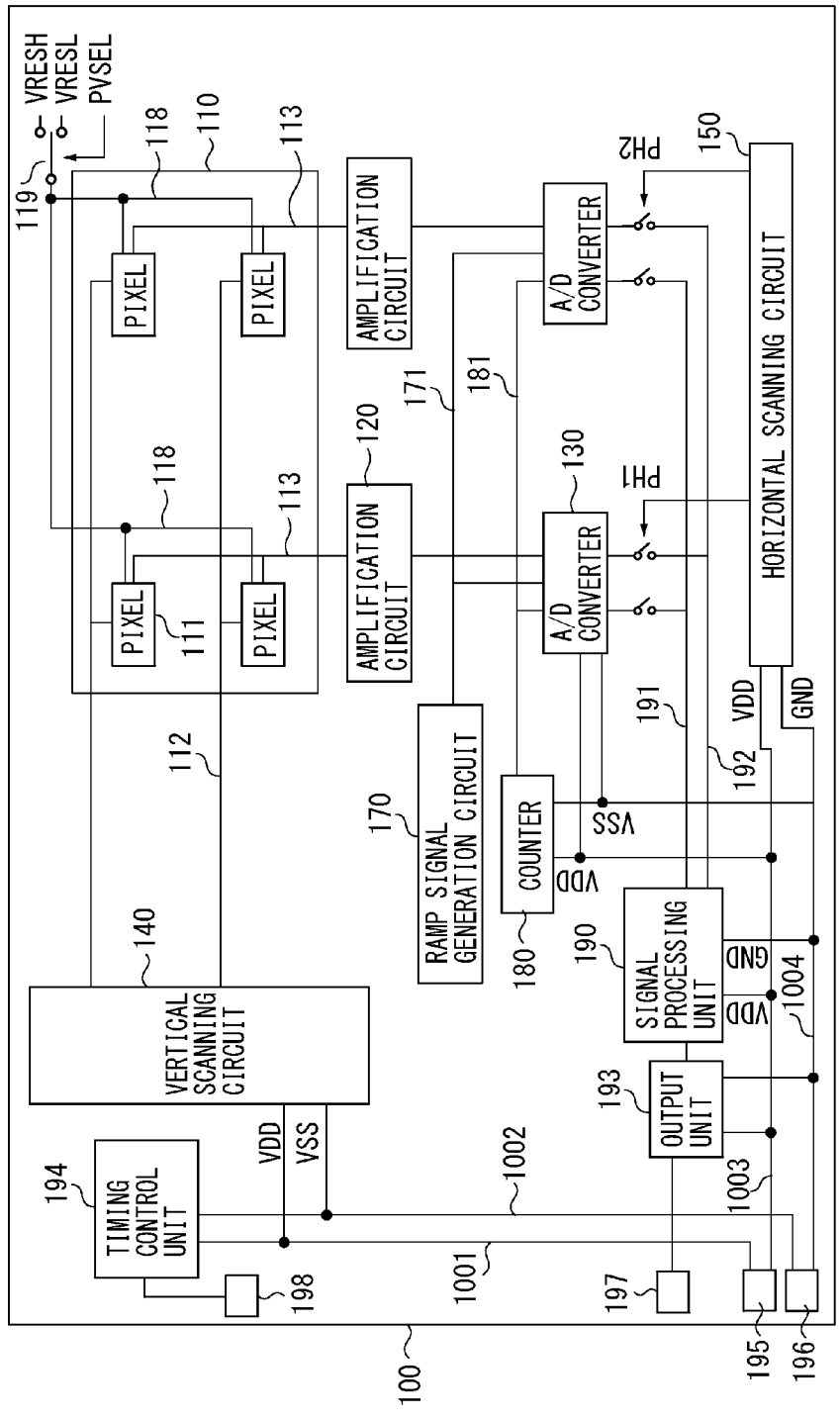
FIG. 1 is a block diagram schematically illustrating a photoelectric conversion apparatus according to a first exemplary embodiment.

Various exemplary embodiments, features, and aspects of the disclosure will be described in detail below with reference to the drawings.

Similar components are denoted by similar reference numerals throughout the drawings, and repeated description will be avoided.

Referring to FIG. 1, a schematic configuration of a photoelectric conversion apparatus 100 according to a first exemplary embodiment will be described. The purpose of FIG. 1 is to illustrate the schematic configuration of a photoelectric conversion apparatus, not to illustrate actual arrangement on a semiconductor substrate. In reality, an area of a pixel array occupies most part of a chip area in many cases. Thus, peripheral circuits located outside the pixel array can be arranged close to one another.

The photoelectric conversion apparatus 100, such as a complementary metal-oxide semiconductor (CMOS) image sensor, photoelectrically converts incident light indicating an object by a photoelectric conversion element, and outputs an electric signal acquired by the photoelectric conversion as digital data to the outside.

The photoelectric conversion apparatus 100 can include a pixel array 110 where a plurality of pixels 111 is disposed in a matrix. FIG. 1 illustrates four pixels 111 for simplicity. However, the number of pixels 111 is not limited to this. More pixels can be included. In each pixel 111, light incident on the photoelectric conversion apparatus 100 is photoelectrically converted into an analog signal.

The photoelectric conversion apparatus 100 can further include a vertical scanning circuit 140. The vertical scanning circuit 140 includes a digital circuit. In the digital circuit, an input signal is a digital signal, and an output signal is also a digital signal. The vertical scanning circuit 140 sequentially or randomly supplies a driving signal to row selection lines 112 arranged for each pixel row or a plurality of pixel rows. Accordingly, the vertical scanning circuit 140 can be a pixel driving unit.

A shift register or a decoder can be used for the pixel driving unit, and this can be a digital circuit. As described below, a first voltage and a second voltage lower than the first voltage can be supplied to the digital circuit included in the pixel driving unit.

When a driving pulse signal is supplied to the row selection line 112, an analog signal can be read from each pixel 111 included in a corresponding pixel row to a column signal line 113.

As the analog signal from the pixel array 110, a noise signal that is a reset level signal of the pixel 111 and a pixel signal where a noise signal is superimposed on a signal according to charges generated by photoelectric conversion are read. By removing the noise signal from the pixel signal, a noise-reduced signal can be acquired.

The photoelectric conversion apparatus 100 can further include an amplifier circuit 120 and an A/D converter 130 for each column signal line 113. The amplifier circuit 120 amplifies the analog signal output from the pixel 111 via the column signal line 113 to supply the amplified analog signal to the A/D converter 130. The A/D converter 130 converts the input analog signal into a digital signal.

The photoelectric conversion apparatus 100 can further include a ramp signal generation circuit 170 and a counter 180. The ramp signal generation circuit 170 generates a ramp signal Vramp to supply it through a ramp signal line 171 to each A/D converter 130. The counter 180 supplies a count value Cnt through a count data line 181 to each A/D converter 130.

As the counter 180, for example, a gray counter or a binary counter can be used, and the counter 180 can have an up-and-down function. The present exemplary embodiment includes the plurality of A/D converters 130 that shares the ramp signal generation circuit 170 and the counter 180. However, each A/D converter 130 may include these components.

The photoelectric conversion apparatus 100 can further include a horizontal scanning circuit 150 and a signal processing unit 190. The horizontal scanning circuit 150 sequentially outputs digital data output from the A/D converter 130 to digital signal lines 191 and 192 for each column. The digital signal transferred to the digital signal lines 191 and 192 is supplied to the signal processing unit 190.

The signal processing unit 190 sequentially receives the digital signal from the A/D converter 130 to execute predetermined signal processing. The signal processing unit 190 includes a digital circuit. The digital circuit receives the digital signal and outputs it. In the present exemplary embodiment, a logic circuit such as an AND circuit or a NOT circuit can constitute the digital circuit.

In the present exemplary embodiment, a digital signal indicating a noise signal and a digital signal indicating a pixel signal are sequentially read to the digital signal lines 191 and 192. For example, the signal processing unit 190 subtracts the digital signal indicating the noise signal from the digital signal indicating the pixel signal.

The photoelectric conversion apparatus 100 can further include an output unit 193. The output unit 193 can use a configuration where the signal from the signal processing unit 190 is simply buffered. Alternatively, the output unit 193 can execute signal processing compatible with low voltage differential signaling (LVDS) together with the signal processing unit 190.

The photoelectric conversion apparatus 100 can further include a timing control unit 194 that controls an operation of the photoelectric conversion device 100 by supplying a pulse signal to the respective components. FIG. 1 illustrates no signal line for transmitting the pulse signal from the timing control unit 194 to each component. The pulse signal supplied from the timing control unit 194 will be described in detail below referring to a timing chart.

A pad 195 receives a first voltage VDD from the outside. A pad 196 receives a second voltage GND. The first voltage VDD is higher than the second voltage GND. For example, the first voltage VDD is 5V, 3.3V, or 1.8V.

For example, the second voltage GND is 0V. These voltages can be changed via a level shift circuit at a stage where they are supplied to real circuits. However, the level relationship is not changed between the first voltage VDD and the second voltage GND. The positional relationship between the pads 195 and 196 can take various positions.

A pad 197 is an output pad for outputting the signal output via the output unit 193 to the outside. A pad 198 is an input pad used by the timing control unit 194 for receiving a control signal from the outside.

In the photoelectric conversion apparatus according to the present exemplary embodiment, the plurality of pixels, the pixel driving unit, the plurality of A/D converters, and the signal processing unit can be arranged on one and the same semiconductor substrate.

A first conductor 1001 supplies a first voltage to at least the digital circuit of the vertical scanning circuit 140. A second conductor 1002 supplies a second voltage lower than the first voltage to at least the digital circuit of the vertical scanning circuit 140. A third conductor 1003 supplies a third voltage to at least the digital circuit of the signal processing unit 190. A fourth conductor 1004 supplies a fourth voltage lower than the third voltage to at least the digital circuit of the signal processing unit 190.

In this case, the first voltage and the third voltage are equal in value, and the second voltage and the fourth voltage are equal in value. Pads to which the voltages are supplied can be common. The voltage values can be different. However, the level relationship therebetween must be set based on the difference.

In the present exemplary embodiment, the inclusion of the amplifier circuit 120 in the photoelectric conversion apparatus 100 enables the influence of noise generated at the A/D converter 130 to be reduced. However, without including the amplifier circuit 120 in the photoelectric conversion apparatus 100, an analog signal from the pixel 111 may be directly supplied to the A/D converter 130 via the column signal line 113.

In the example illustrated in FIG. 1, the amplifier circuit 120, the A/D converter 130, and the horizontal scanning circuit 150 are arranged on one side of the pixel array 110. However, these components may be arranged on both sides of the pixel array 110, and sorted to one of the sides for each pixel column.

Figure 2:
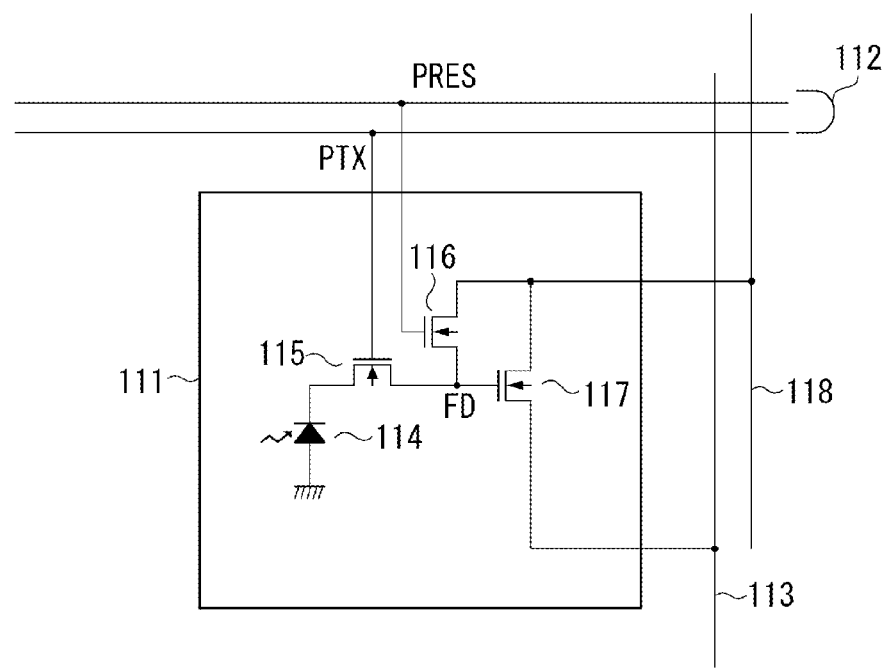
FIG. 2 is a circuit diagram illustrating a pixel according to the first exemplary embodiment.

Next, referring to equivalent circuit diagrams of FIGS. 2 and 3, an example of a schematic configuration of the pixel 111 and the amplifier circuit 120 included in the photoelectric conversion apparatus 100 will be described. The pixel 111 and the amplifier circuit 120 may be configured in any way as long as an analog signal for calculating a pixel value of the pixel 111 can be supplied to the A/D converter 130.

The pixel 111 includes a photodiode 114 that functions as a photoelectric conversion element for executing photoelectric conversion, and a plurality of transistors. The photodiode 114 can be electrically connected to a floating diffusion (FD) via a transfer switch 115 that is a transfer unit.

The FD can be electrically connected to a pixel power line 118 via a reset switch 116, and to a gate of an amplification transistor 117. The amplification transistor 117 can function as a pixel amplification unit. An input node of the pixel amplification unit is a gate for the FD and the amplification transistor 117 connected to the FD. Charges of the photodiode 114 are transferred to the input node of the pixel amplification unit via the transfer switch 115.

A drain of the amplification transistor 117 is electrically connected to the pixel power line 118, and a source of the amplification transistor 117 is electrically connected to the column signal line 113. A gate of the reset switch 116 is electrically connected to one of the row control lines 112, namely, a reset line PRES.

A gate of the transfer switch 115 is electrically connected to one of the row control lines, namely, a transfer line PTX. The pixel power line 118 is electrically connected to VRESH or a VRESL lower in voltage than the VRESH by a power selection switch 119.

By combining an operation of the reset switch 116 with an operation of the power selection switch 119, selection or nonselection of a pixel line is performed, which is described in detail below. The pixel circuit of this type is suitable for realizing a micro pixel because the number of transistors in a unit pixel can be reduced more than that in a pixel circuit of a type that includes a switch between the source of the amplification transistor 117 and the column signal line 113.

However, a switch may be provided between the source of the amplification transistor 117 and the column signal line 113. The pixel circuit is not limited to this. However, a configuration having a function of amplifying a signal in the pixel is desirable.

Figure 3:
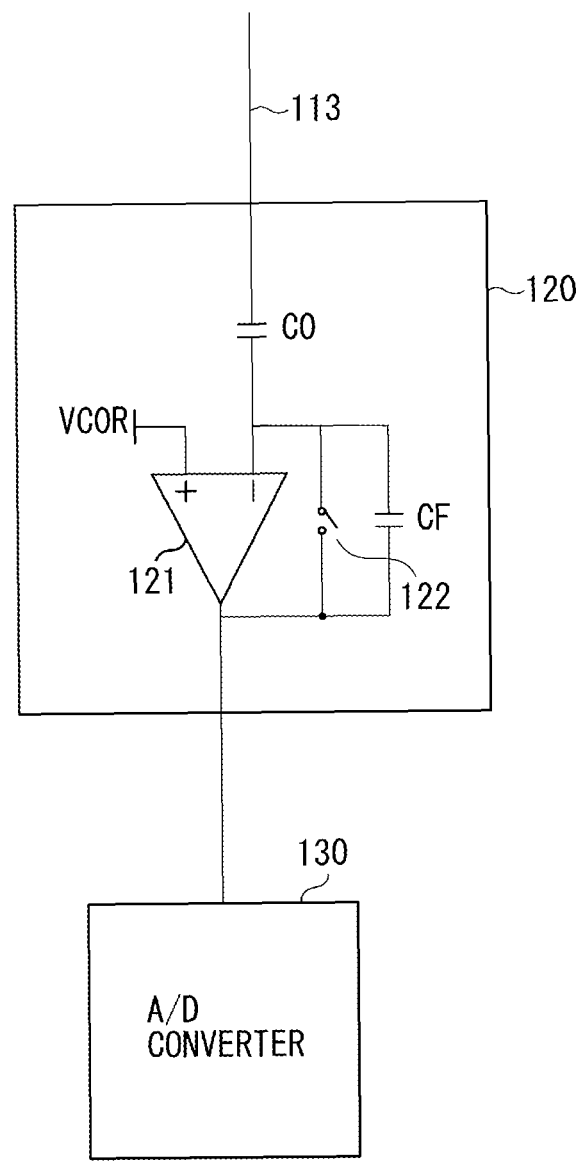
FIG. 3 is a circuit diagram illustrating an amplifier circuit according to the first exemplary embodiment.

The amplifier circuit 120 includes a circuit element illustrated in FIG. 3 to constitute an inversion amplifier. An inversion input terminal of an amplifier 121 is electrically connected to the column signal line 113 via a clamp capacitor Co. A switch can be provided between the clamp capacitor and the column signal line 113.

A voltage VC0R as a reference voltage is supplied to a noninversion input terminal of the amplifier 121. An output terminal of the amplifier 121 is connected to the A/D converter 130 directly or via a switch. A feedback capacitor Cf and a reset switch 122 are connected in parallel between the inversion input terminal and the output terminal of the amplifier 121.

With this configuration, the amplifier circuit 120 amplifies the signal input via the column signal line 113 by a capacity value ratio of the clamp capacitor Co and the feedback capacitor Cf to output it. By including a plurality of parallel capacitors in the feedback capacitor, a configuration where gains are variable can be achieved.

Figure 4:
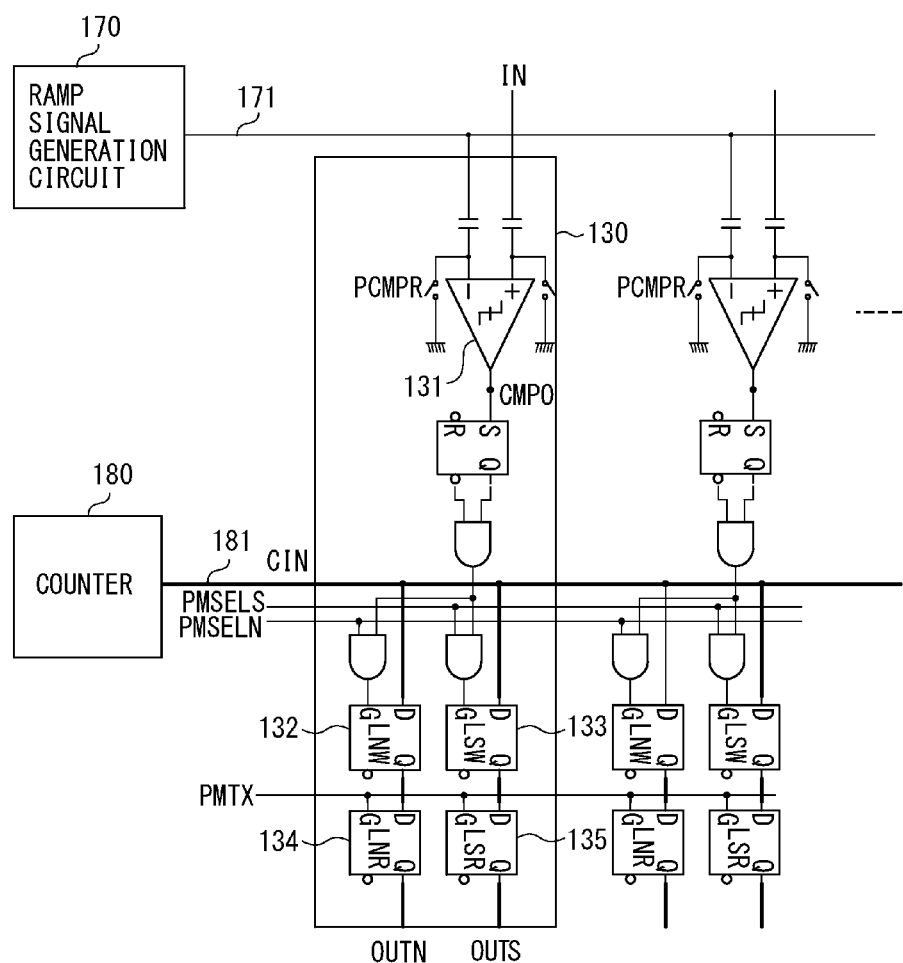
FIG. 4 is a circuit diagram illustrating an A/D converter according to the first exemplary embodiment.

Next, referring to an equivalent circuit diagram of FIG. 4, a schematic configuration of the A/D converter 130 illustrated in FIG. 1 will be described.

The A/D converter 130 can include an input terminal IN, an output terminal OUTN, an output terminal OUTS, a comparator 131, and latch circuits 132 and 133. An analog signal is input to the input terminal IN via the column signal line 113.

The comparator 131 compares an input voltage with a threshold voltage of a comparison target, and outputs an output signal CMPO of a level according to the comparison result. Four latch circuits LNW, LNR, LSW, and LSR for storing digital data according to the output signal CMPO of the comparator 131 are provided.

The latch circuit LNW can function as a first memory for storing the A/D converted digital signal. The D input of the latch circuit LNW and the D input of the latch circuit LSW are both connected to the count signal line 181. A G input of the latch circuit LNW is connected to an output line of the AND gate to which the output CMPO of the comparator 131 and a control signal PMSELN are input.

A G input of the latch circuit LSW is connected to the output line of the AND gate to which the output CMPO of the comparator 131 and a control signal PMSELS are input. A Q output of the latch circuit LNW is connected to a D input of the latch circuit LNR, and a Q output of the latch circuit LSW is connected to a D input of the latch circuit LSR.

A G input of the latch circuit LNR and a G input of the latch circuit LSW are both connected to a control line PMTX. A Q output of the latch circuit LNR is connected to the output terminal OUTN, and a Q output of the latch circuit LSR is connected to the output terminal OUTS. The latch circuits LSR and LNR function as second memories for receiving data output from the first memory and outputting the data to the signal processing unit 190.

Figure 5:
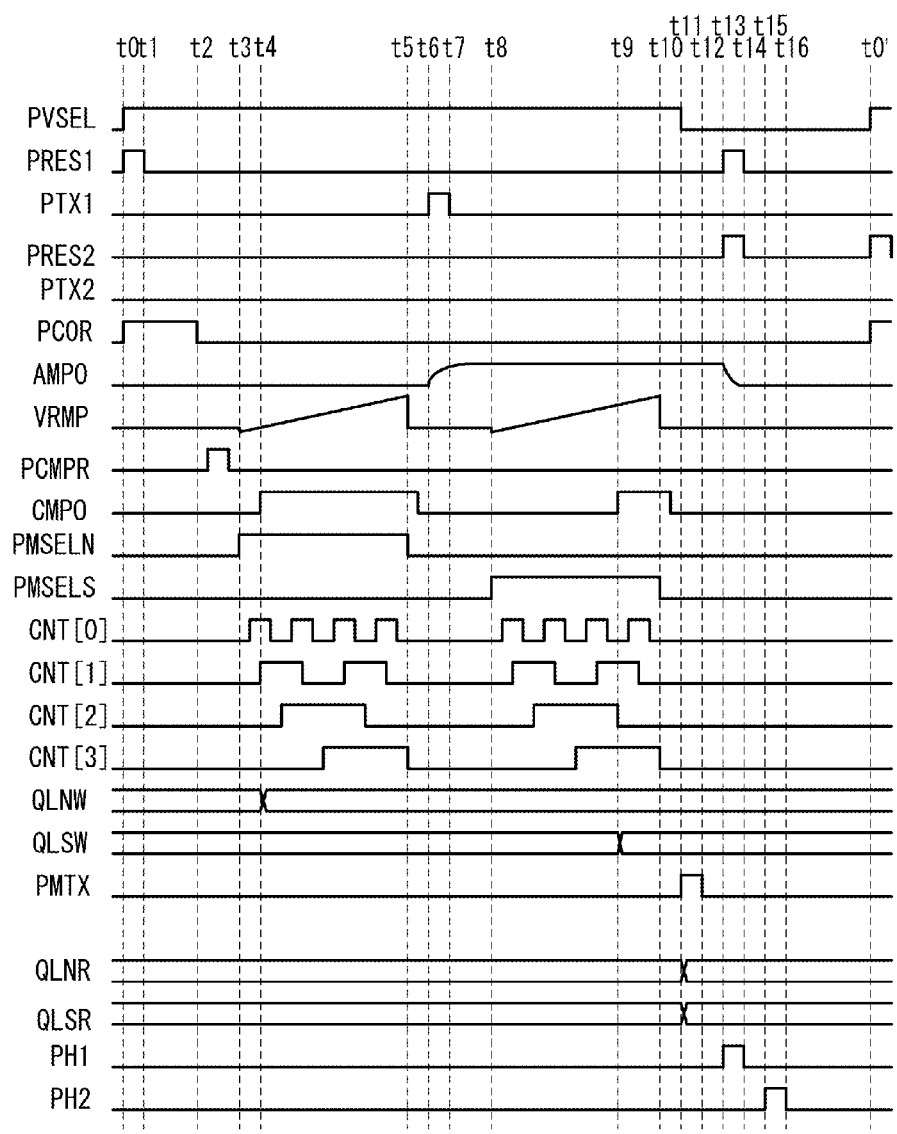
FIG. 5 is a timing chart illustrating control signals for driving the photoelectric conversion apparatus according to the first exemplary embodiment.

Referring to FIG. 5, an operation of the photoelectric conversion apparatus illustrated in FIGS. 1 to 4 will be described. During a period of t0 to t0' illustrated in FIG. 5, a signal of the pixel 111 included in a certain row (row indicated by subscript "1") is converted into a digital signal by the A/D converter 130, and then reaches the signal processing unit 190. In a pulse chart hereinafter, each switch is set conductive at a high level.

First, at time t0, a row selection pulse PVSEL is set to a high level (hereinafter referred to as "H", and low level is referred to as "L") to supply a voltage VRESH to the pixel power line 118. During a period of t0 to t1, a pixel reset pulse PRES is H, and the FD is reset to the voltage VRESH by the reset switch 116.

In other rows (rows indicated by subscript "2" and all other rows), at timing equivalent to a period of t3 to t14, the FD has been set to the voltage VRESL, which will be described below.

A constant current source (not illustrated) electrically connected to the column signal line 113 and the pixels of all the rows connected to the column signal line 113 constitute a multi-input source follower circuit where a source is common.

Since the amplification transistor 117 of the pixel is an N-type transistor, a signal of the row indicated by the subscript "1" at which the gate potential is relatively higher than the gate potentials of other rows is output to the column signal line 113. A relationship is reversed when the amplification transistor 117 of the pixel is a P-type transistor, and a voltage applied to the FD of the row for selection is relatively higher than voltages of other rows.

During a period of t0 to t2, an output corresponding to the reset state of the pixel 111 (hereinafter, referred to as pixel reset level) is output to the column signal line 113. During this period, a reset pulse PC0R is "H", and the amplifier circuit 120 clamps the pixel reset level. Hereinafter, the output of the amplifier circuit 120 at this time is referred to as an N level. The reset pulse PC0R is supplied to the reset switch 122 illustrated in FIG. 3.

In a period of t2 to t5, the A/D converter 130 converts the N level into a digital signal. Hereinafter, this is referred to as N conversion. In a period of t2 to t3, a comparator reset pulse PCMPO is H, and a difference voltage between the N level output from the amplifier circuit 120 and a reference voltage (hereinafter, referred to as a ramp reset level) generated at a ramp signal generation unit is clamped.

Then, the ramp signal drops to a level lower by a predetermined voltage than the ramp reset level, and rises at certain inclination in the period of t3 to t5. At the time of t4, when the N level and the ramp signal coincide with each other, the comparator output CMPO changes from L to H.

On the other hand, counter signals supplied from the counter 180 count time in a period of t3 to t5 from the time t3. In the present exemplary embodiment, a 4-bit gray counter is used. However, the counter is not limited to this. When the comparator output changes from L to H at the time of t4, the latch LNW latches the counter signal corresponding to the N level. At the time of t5, the N conversion is ended.

Then, in the period of t6 to t7, a pixel transfer pulse is H, light charges corresponding to the amount of incident light are read from a photodiode (PD), and a level where a photoelectric conversion output is superimposed on the pixel reset level is read to the column signal line 113. Then, the output inversely amplified by the amplifier circuit 120 is input to the A/D converter 130. Hereinafter, the output from the amplifier circuit 120 at this time is referred to as an S level.

In the period of t8 to t10, as in the case of the period of t3 to t5, A/D conversion is carried out. However, an analog signal to be converted is at an S level. Hereinafter, this is referred to as S conversion. During the S conversion, at the time of t9, the latch LSW latches a counter signal corresponding to the S level. At the time of t10, the S conversion is ended.

Lastly, in the period of t11 to t12, a memory transfer pulse PMTX is H, and the digital signals of the latch LNW and the latch LSW are transferred to the latch LNR and the latch LSR.

The digital signals of one row stored in the latches LNR and LSR are, in the period of t13 to t16, sequentially output to the signal processing unit 190 via the digital signal lines 191 and 192 according to selection signals PH1 and PH2 output from the horizontal scanning circuit 150. The signal processing unit calculates a difference between an N conversion value and an S conversion value, and outputs the result as a photoelectric conversion output to the outside of the photoelectric conversion unit.

On the other hand, at the time of t11, a row selection pulse changes from H to L, and a voltage VRESL is supplied to the pixel power line by the power selection switch 119. In the period of t13 to t14, when pulses PSEL of all the rows are H, the reset switch of all the rows is turned ON, and the voltage of the FD is set to a voltage VRESL. By this operation, a state where no row of the pixel array 110 is selected is set.

Similarly, a next row (indicated by subscript "2") is selected by the vertical scanning circuit 140. A similar reading operation is carried out. By completing scanning through the pixel array, an image of one frame is output.

A period to be focused on is the period of t13 to t14. During this period, in the vertical scanning circuit 140 that drives the pixel array, simultaneous switching where the reset pulses of all the rows are set to H is carried out. In this case, all the rows are all pixels included in at least a reading area. When the photoelectric conversion apparatus is used as an imaging apparatus, the reading area corresponds to an imaging area where an area is appropriately changed according to a field angle.

The signal processing unit 190 executes signal processing such as subtraction of high-speed digital signals input from the digital signal lines 191 and 192. In the conventional photoelectric conversion apparatus, noise is mixed in a signal output to the outside at rising or falling timing of a reset pulse. This is because current flows through many elements at the timing to cause potential fluctuation on the voltage supply wire, mainly affecting the signal processing unit 119.

The photoelectric conversion apparatus according to the present exemplary embodiment can reduce such noise. This can be realized because main portions of conductors that supply voltages to the vertical scanning circuit 140 and the signal processing unit 190 are isolated from each other.

Figure 10:
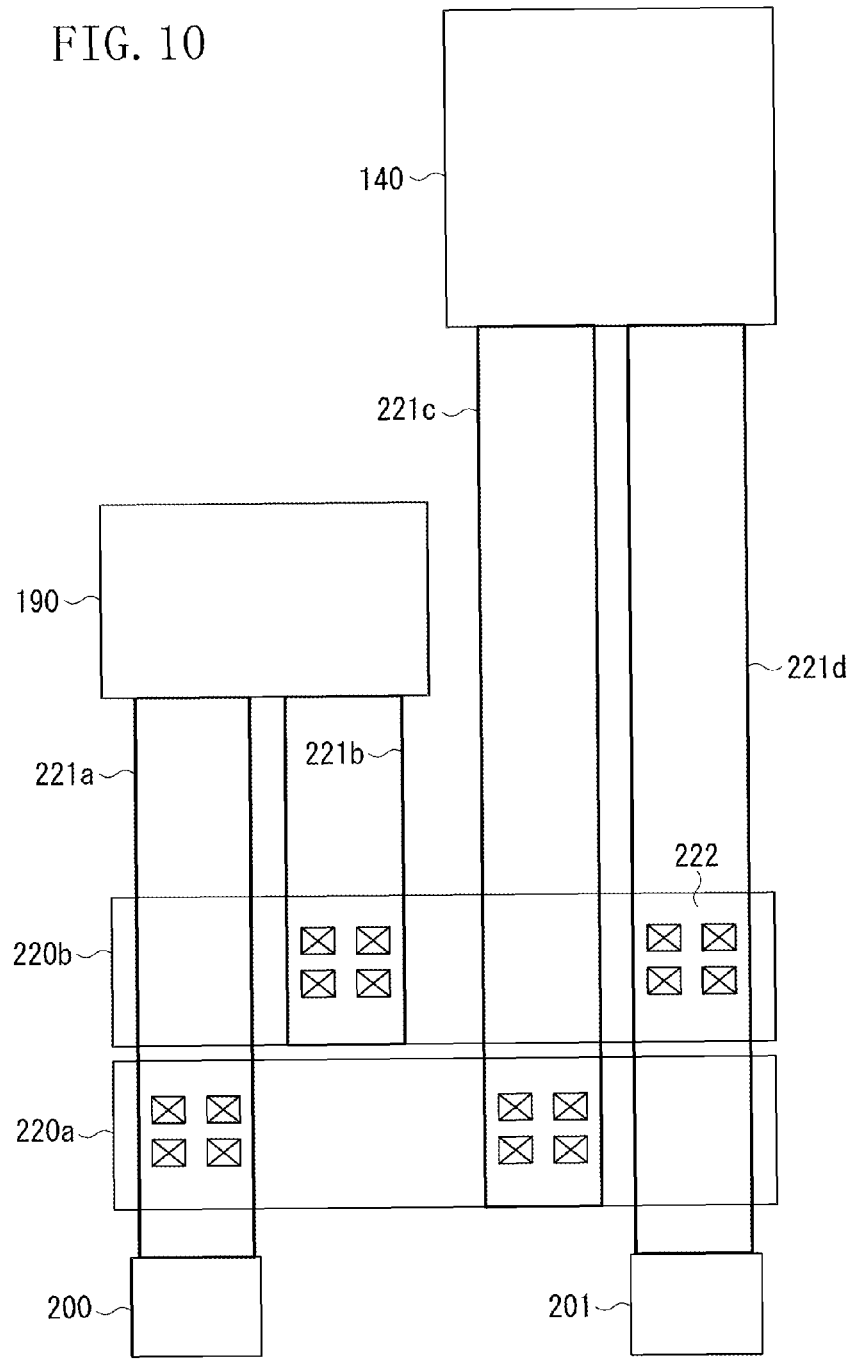
FIG. 10 is a top view illustrating a conductor according to the first exemplary embodiment.

FIG. 10 illustrates an example of detailed conductor patterns. Specifically, FIG. 10 illustrates plane patterns of the conductors that respectively supply voltages to the vertical scanning circuit 140 and the signal processing unit 190. In this case, two voltages different in value, namely, a first voltage and a second voltage lower than the first voltage, are supplied to the vertical scanning circuit 140 and the signal processing unit 190. Hereinafter, an example in which wires are used as conductors or conductor patterns will be described.

The first voltage and the second voltage are supplied from the input pads at least via two wiring layers. First, the first voltage will be described. The first voltage or a similar voltage is supplied to a first input pad 200. The first input pad 200 can be configured with a third wiring layer from the semiconductor substrate.

A voltage is transmitted from the first input pad 200 to a wire 221a located on a second wiring layer below the third wiring layer via a plug (not illustrated). The wire 221a extends upward as illustrated in FIG. 10 to supply the first voltage to the signal processing unit 190. The wire 221a is electrically connected to a predetermined element of the signal processing unit 190 via the plug.

The first voltage can be supplied to the vertical scanning circuit 140. The wire 221a is electrically connected to a wire 220a located on a first wiring layer below the second wiring layer via the plug. The wire 220a is illustrated to horizontally extend. The wire 220a is electrically connected to a wire 221c located on the second wiring layer via the plug.

The wire 221c extends upward, and is electrically connected to the vertical scanning circuit 140. The wire 221a and the wire 221c constitute main portions of conductors that transmit voltages from the first input pad 200 to the respective circuits. It is desirable for the wires 221a and 221c to be arranged in parallel to each other.

These main portions are electrically isolated. An example of an electrically isolated state is arrangement of an insulator between the wires 221a and 221c. Normally, a wire for supplying a voltage is widened as much as possible to reduce resistance.

In the configuration illustrated in FIG. 10, integrating the wires 221a and 221c into one wire reduces resistance and the influence of a voltage drop. However, in the present exemplary embodiment, because of the newly found problem, the wires corresponding to the main portions for transmitting the voltage are isolated.

The main portions for transmitting the voltage are portions occupying 60% or more of a distance from the pad to the respective circuit elements. It is more desirable if the main portions for transmitting the voltage occupy 80% or more of the distance from the pad to the respective circuit elements and isolated. In other words, 60% or more of the distance from the input pad to each circuit is isolated.

The second voltage is processed similarly to the first voltage. The second voltage or a similar voltage is supplied to a second input pad 201. The second input pad 201 can be configured by a third wiring layer. A voltage is transmitted from the second input pad 201 to a wire 221d located on a second wiring layer below the third wiring layer via a plug (not illustrated).

The wire 221d extends upward as illustrated in FIG. 10 to supply the second voltage to the vertical scanning circuit 140. The wire 221d is electrically connected to a predetermined element of the vertical scanning circuit 140 via the plug. The second voltage is also supplied to the signal processing unit 190.

The wire 221d is electrically connected to a wire 220b located on a first wiring layer below the second wiring layer via the plug. The wire 220b horizontally extends. The wire 220b is electrically connected to a wire 221b located on the second wiring layer via the plug.

The wire 221b extends upward in FIG. 10, and is electrically connected to the signal processing unit 190. The wire 221b and the wire 221d constitute main portions of conductors that transmit voltages from the second input pad 201 to the respective circuits.

It is desirable for the wires 221b and 221d to be arranged in parallel to each other.

These main portions are electrically isolated. In other words, an insulator is disposed between the wires 221b and 221d. Normally, a wire for supplying a voltage is widened as much as possible to reduce resistance. In the configuration illustrated in FIG. 10, integrating the wires 221b and 221d into one wire reduces resistance and the influence of a voltage drop. However, in the present exemplary embodiment, because of the newly found problem, the wires are isolated.

In the above-described example, similar wiring layers constitute the main portions for transmitting the voltage. However, there is still a margin for more wiring layers, different wiring layers can be arranged. Specifically, the wire 221a and the wire 221c are arranged on different wiring layers. Alternatively, the wire 221b and the wire 221d are arranged on different wiring layers.

Figure 11:
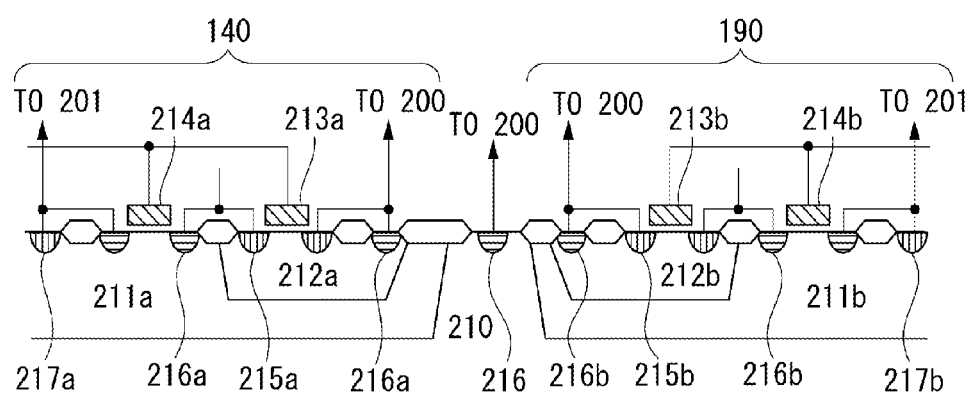
FIG. 11 is a partial sectional view illustrating a vertical scanning circuit and a signal processing unit.

FIG. 11 is a partial sectional view illustrating the vertical scanning circuit 140 and the signal processing unit 190.

First, the vertical scanning circuit 140 will be described. A P-type well 211a is disposed on the front surface side of an N-type semiconductor substrate 210. Further, an N-type well 212a is disposed to be included in the P-type well 211a. An N-type transistor is disposed in the P-type well 211a, and a P-type transistor is disposed in the N-type well 212a. Hereinafter, as the transistor, an example of a metal-oxide semiconductor (MOS) transistor will be described.

The P-type well 211a includes an N-channel MOS (NMOS) transistor 214a, and the N-type well 212a includes a P-channel MOS (PMOS) transistor 213a. A P-type semiconductor area 215a is a source or a drain of the PMOS transistor 213a. An N-type semiconductor area 216a is for supplying the first voltage to the N-type well 212a. A P-type semiconductor area 217a is for supplying the second voltage to the P-type well 211a.

Next, the signal processing unit 190 will be descried. A P-type well 211b is disposed on the front surface side of the N-type semiconductor substrate 210. Further, an N-type well 212b is disposed to be included in the P-type well 211b. The P-type well 211b includes an NMOS transistor 214b, and the N-type well 212b includes a PMOS transistor 213b.

A P-type semiconductor area 215b is a source or a drain of the PMOS transistor 213b. An N-type semiconductor area 216b is for supplying the first voltage to the N-type well 212b. A P-type semiconductor area 217b is for supplying the second voltage to the P-type well 211b.

Thus, the N-type well and the P-type well are independently provided in the vertical scanning circuit 140 and the signal processing unit 190. The well that includes the P-type transistor constituting the digital circuit of the vertical scanning circuit is referred to as a first N-type well, and the well that includes the N-type transistor is referred to as a first P-type well.

The well that includes the P-type transistor constituting the digital circuit of the signal processing unit 190 is referred to as a second N-type well, and the well that includes the N-type transistor is referred to as a second P-type well. The first N-type well and the first N-type well are isolated, and the second P-type well and the second P-type well are isolated.

The isolated state of the wells can be achieved by disposing an opposite conductive well between the wells. Alternatively, the wells can be isolated by an insulator.

This configuration is more effective for preventing erroneous operations because it suppresses noise propagation via the semiconductor substrate. Thus, since common impedance between the conductors that supply the first voltage to the vertical scanning circuit 140 and the signal processing unit 190 can be reduced, the influence of voltage fluctuation at the vertical scanning circuit 140 on the signal processing unit 190 can be reduced. The opposite is true.

Further, since common impedance between the conductors that supply the second voltage to the vertical scanning circuit 140 and the signal processing unit 190 can be reduced, the influence of voltage fluctuation at the vertical scanning circuit 140 on the signal processing unit 190 can be reduced. The opposite is true. In the present exemplary embodiment, the conductors that supply the first voltage and the conductors that supply the second voltage are isolated. However, either of the former and latter conductors may be isolated.

To isolate the conductors, it is desirable to set a separation length so that the common impedance can be 1Ω or smaller. When extension of a chip area of the photoelectric conversion apparatus is allowed, the first input pad 200 and the second input pad 201 can be independently provided in the vertical scanning circuit 140 and the signal processing unit 190.

It is preferable to apply the present exemplary embodiment to a configuration where a scanning rate of the horizontal scanning circuit 150 is about 70 MHz or higher. In other words, the present exemplary embodiment is suitable to a configuration that has a mode of reading a signal processed by the signal processing unit 190 to the outside at a frequency equal to or higher than 70 MHz. The horizontal scanning circuit 150 can operate at the same rate in cooperation with the signal processing unit 190.

In this case, it is desirable not to isolate the conductors that supply the first voltage and the second voltage to the signal processing unit 190 and the conductors that supply the first voltage and the second voltage to the horizontal scanning circuit 150. Even when isolated, it is desirable for an area of a separation area to be small. Even when isolated, it is desirable to isolate an area smaller than 60%.

More desirably, an area to be isolated is smaller than 30%. In terms of common impedance, the common impedance between the conductors that supply the first voltage to the horizontal scanning circuit 150 and the signal processing unit 190 is smaller than that between the conductors that supply the first voltage to the vertical scanning circuit 140 and the signal processing unit 190. This relationship applies to the second voltage.

The same applies to the output unit 193. It is desirable not to isolate the conductors that supply the first voltage and the second voltage to the output unit 193 and the conductors that supply the first voltage and the second voltage to the signal processing unit 190. Even when isolated, it is desirable for an area of a separation area to be small.

Even when isolated, it is desirable to isolate an area smaller than 60%. More desirably, an area to be isolated is smaller than 30%. It is desirable that the common impedance between the conductors that supply the first voltage to the output unit 193 and the signal processing unit 190 is smaller than that between the conductors that supply the first voltage to the vertical scanning circuit 140 and the signal processing unit 190. This relationship applies to the second voltage.

Figure 6:
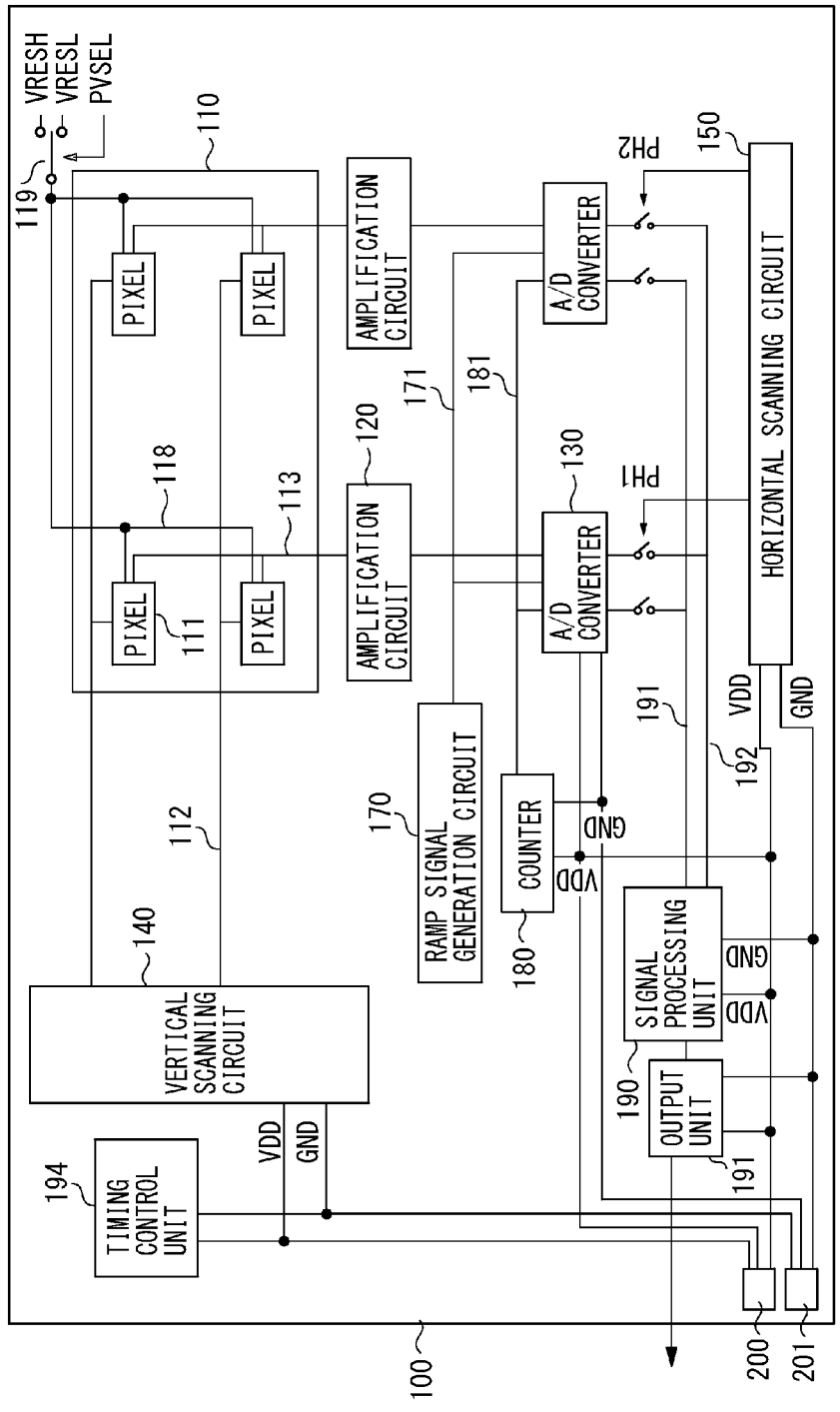
FIG. 6 is a block diagram schematically illustrating a photoelectric conversion apparatus according to a second exemplary embodiment.

Referring to FIG. 6, a schematic configuration of a photoelectric conversion apparatus according to a second exemplary embodiment will be described. While similar in many respects, the present exemplary embodiment is different from the first exemplary embodiment in that a main portion of a conductor configured to supply a first voltage to an A/D converter 130 is isolated from that of a conductor configured to supply the first voltage to a signal processing unit. The same applies to conductors that supply a second voltage.

In addition, the photoelectric conversion apparatus has a function of writing initial values in latches LNW and LSW in the A/D converter 130. The initial values in this case are equal to or larger than a full scale of the A/D converter 130.

Figure 7:
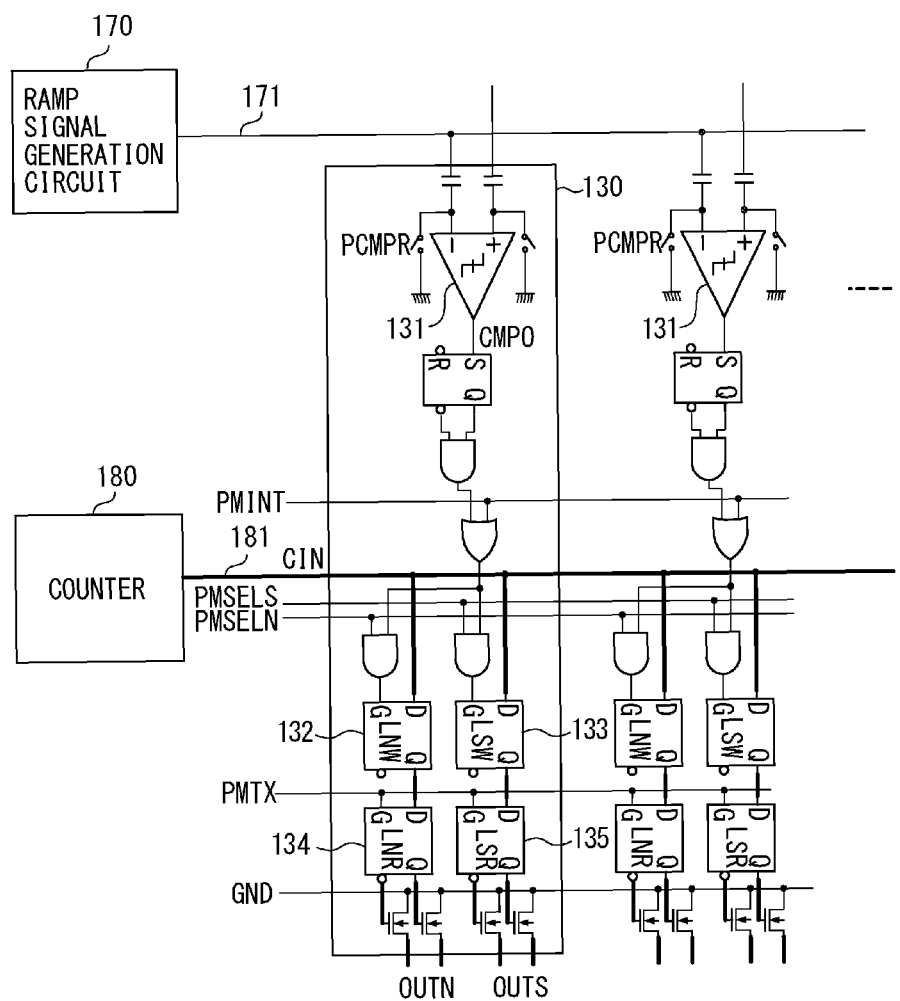
FIG. 7 is a circuit diagram illustrating an A/D converter according to the second exemplary embodiment.
Figure 8:
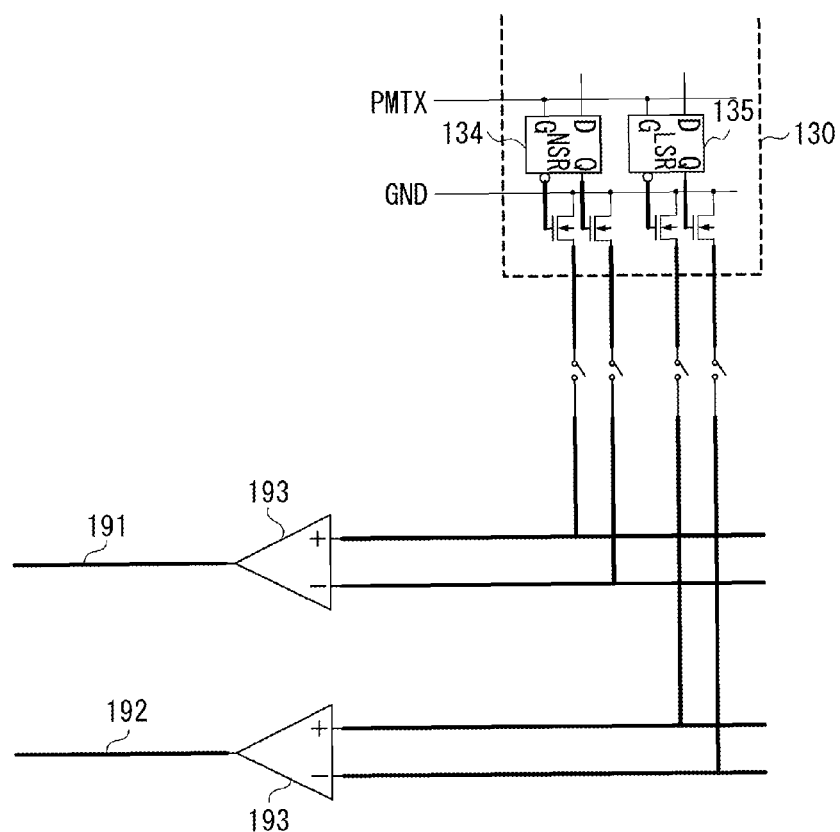
FIG. 8 is a circuit diagram illustrating a digital signal line in detail according to the second exemplary embodiment.

FIG. 7 illustrates a configuration of the A/D converter 130 according to the present exemplary embodiment. A result of OR calculation of an initial pulse PMINT and an output of a comparator 131 is supplied to G inputs of the latches LNW and LSW. By inputting the initial pulse PMINT and outputting a predetermined value from a counter, the initial values can be written in the latches LNW and LSW.

For example, when an analog signal exceeding the full scale of the A/D converter 130 is input, an overflowing state occurs. However, according to the configuration of the present exemplary embodiment, a full scale of an A/D conversion value or a value exceeding the full scale can be written as an initial value. Accordingly, even when the A/D converter 13 overflows, an appropriate signal can be output.

Figure 9:
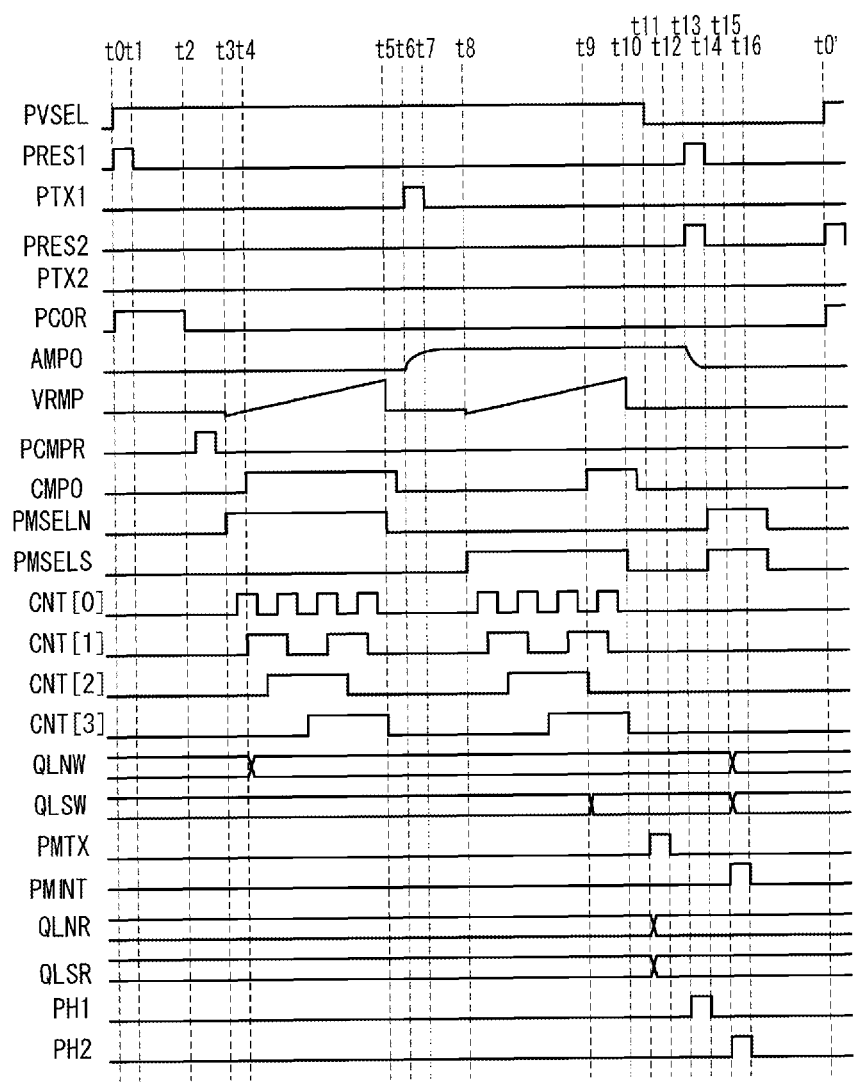
FIG. 9 is a timing chart illustrating control signals for driving the photoelectric conversion apparatus according to the second exemplary embodiment.

FIG. 9 is a timing chart for driving the photoelectric conversion apparatus according to the present exemplary embodiment. Different from the first exemplary embodiment, an initialization pulse PMINT is added and, in a period of t15 to t16, initialization operations are carried out almost simultaneously for latches LSW and LNW of all columns. The almost simultaneous execution of the operations means that pulse delay caused by wiring resistance is included.

In this case, digital signals are sequentially transferred through digital signal lines 191 and 192 to a signal processing unit 190, and the signal processing unit 190 executes predetermined signal processing such as subtraction. Accordingly, there is a possibility of incursion of noise in the signal processing unit 190 in the period of t15 to t16.

However, in the photoelectric conversion apparatus according to the present exemplary embodiment, the main portion of the conductor configured to supply the first voltage and the second voltage to the A/D converter 130 is isolated from that of the conductor configured to supply the first voltage and the second voltage to the signal processing unit 190. As in the case of the first exemplary embodiment, these portions are isolated so that common impedance becomes 1Ω or lower.

In the A/D converter 130, when large potential fluctuation occurs in the conductor itself that supplies the first voltage and the conductor itself that supplies the second voltage, noise is mixed in the signals transmitted through the digital signal lines 191 and 192. On the other hand, outputs from latches LNR and LSR may be differentially transmitted, and converted into single-end digital signals by a sense amplifier at a stage before the signal processing unit 190.

This form enables effective removal of noise included in the digital signal itself. It is desirable not to isolate a main portion of a conductor configured to supply the first voltage and the second voltage to the sense amplifier from that of the conductor configured to supply the first voltage and the second voltage to the signal processing unit 190.

Figure 12:
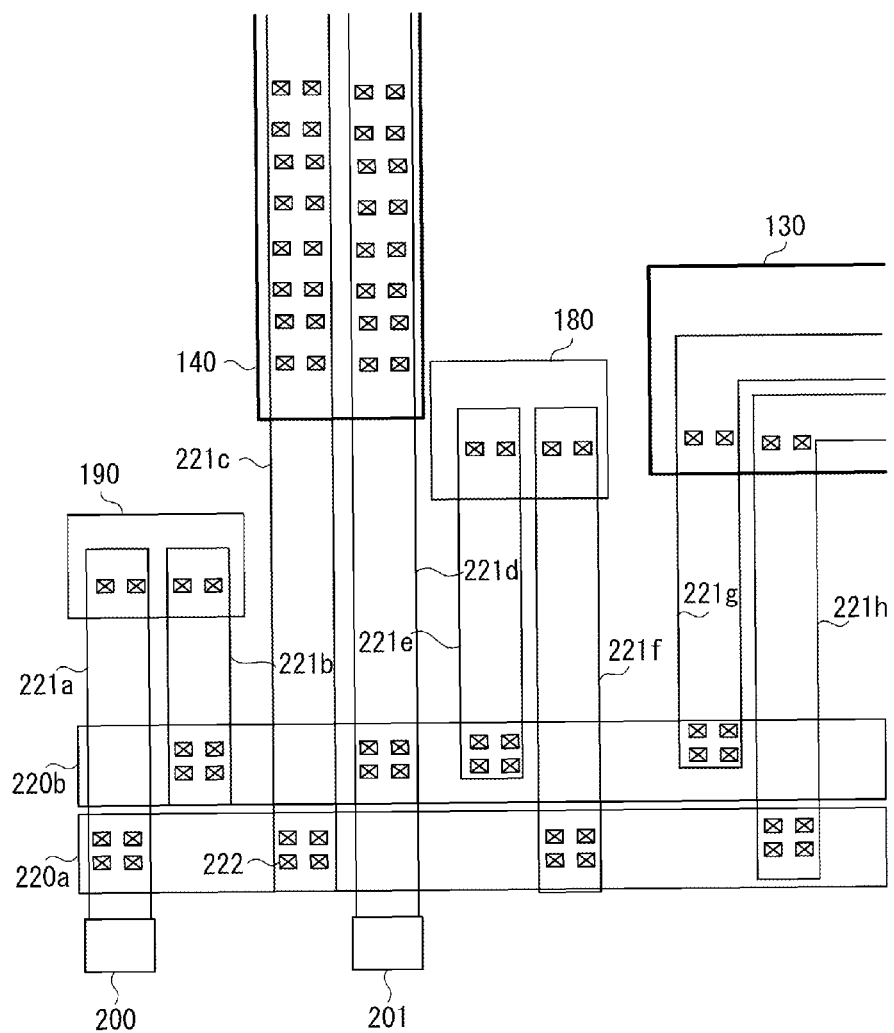
FIG. 12 is a top view illustrating a conductor according to the second exemplary embodiment.

FIG. 12 illustrates an example of conductor patterns according to the present exemplary embodiment. Portions having functions similar to those illustrated in FIG. 10 are denoted by similar reference numerals, and detailed description thereof will be omitted. FIG. 10 illustrates, in an extracted manner, the A/D converter 130, a vertical scanning circuit 140, a counter 180, and a conductor pattern for supplying the first voltage and the second voltage lower than the first voltage to the signal processing unit 190.

A wire 221e is configured with a second wiring layer. The wiring 221e constitutes a main portion of a conductor that transmits the first voltage to the counter 180. The wire 221e is electrically connected to an element included in the counter 180.

A wire 221f is configured with a second wiring layer. The wiring 221f constitutes a main portion of a conductor that transmits the second voltage to the counter 180. The wire 221f is electrically connected to the element included in the counter 180.

A wire 221g is configured with a second wiring layer. The wiring 221g constitutes a main portion of a conductor that transmits the first voltage to the A/D converter 130. The wire 221g is electrically connected to an element included in the A/D converter 130.

A wire 221h is configured with a second wiring layer. The wiring 221h constitutes a main portion of a conductor that transmits the second voltage to the A/D converter 130. The wire 221h is electrically connected to the element included in the A/D converter 130.

The wire 221g is isolated from the wire 221b, and the wire 221h is isolated from the wire 221a. In the present exemplary embodiment, though not illustrated, as in the case of the first exemplary embodiment, it is further desirable to isolate N-type wells including P-type transistors to constitute respective circuits from each other. It is further desirable to isolate P-type wells including N-type transistors that constitute respective circuits from each other.

Specifically, a digital circuit of a pixel driving unit includes a plurality of first P-type transistors and a plurality of first N-type transistors. A first voltage is supplied to a first N-type well in which the plurality of first P-type transistors is arranged, and a second voltage lower than the first voltage is supplied to a first P-type well in which the plurality of first N-type transistors is arranged. A digital circuit of the signal processing unit includes a plurality of second P-type transistors and a plurality of second N-type transistors.

The first voltage is supplied to a second N-type well in which the plurality of second P-type transistors is arranged, and the second voltage is supplied to a second P-type well in which the plurality of first N-type transistors is arranged. The A/D converter includes a plurality of third P-type transistors and a plurality of third N-type transistors.

The first voltage is supplied to a third N-type well in which the plurality of third P-type transistors is arranged, and the second voltage is supplied to a third P-type well in which the plurality of third N-type transistors is arranged. In this configuration, the first N-type well, the second N-type well, and the third N-type well are isolated from one another. The first P-type well, the second P-type well, and the third P-type well are isolated from one another. This configuration is desirable for further improving the noise reduction effect.

According to the photoelectric conversion apparatus of the present exemplary embodiment, noise can be reduced, and appropriate digital data can be output even when the A/D converter 130 overflows. Thus, the photoelectric conversion apparatus having wider use conditions can be realized.

The specific exemplary embodiments have been described above. However, the present invention is not limited thereto, and various changes and modifications can be made. When there is noise caused by a voltage fluctuation between the digital circuits, the conductors of this portion only need to be isolated from each other.

Therefore, the configuration of the second exemplary embodiment can be used in addition to that of the first exemplary embodiment, or each can be used independently. Various signal processes can be considered, and can be applied to the configuration where there is noise caused by a voltage fluctuation between the digital circuits.

While the present disclosure has been described with reference to exemplary embodiments, it is to be understood that the inventive ideas and concepts are not limited to the disclosed exemplary embodiments. The scope of the following claims is to be accorded the broadest interpretation so as to encompass all modifications, equivalent structures, and functions.

This application claims priority from Japanese Patent Application No. 2011-223297 filed Oct. 7, 2011, which is hereby incorporated by reference herein in its entirety.

What is claimed is:

1. A photoelectric conversion apparatus arranged on one semiconductor substrate thereof, comprising:
   a plurality of pixels;
   a vertical scanning circuit that includes a digital circuit configured to supply a driving signal to the plurality of pixels;
   a plurality of A/D conversion circuits configured to convert analog signals received from the pixels into digital signals;
   a signal processing unit that includes a digital circuit configured to sequentially receive the digital signals from the plurality of A/D conversion circuits and execute signal processing; and
   a horizontal scanning circuit configured to sequentially output the digital signals converted by the A/D conversion circuit to the signal processing unit,
   wherein:
   a first voltage and a second voltage, different in value from the first voltage, are supplied to the digital circuit of the vertical scanning circuit;
   a third voltage and a fourth voltage, different in value from the third voltage, are supplied to the digital circuit of the signal processing unit;
   a main portion of a first conductor that supplies the first voltage to the digital circuit of the vertical scanning circuit and a main portion of a second conductor that supplies the third voltage to the digital circuit of the signal processing unit, wherein the main portion of the first conductor and the main portion of the second conductor are isolated from each other;
   the third voltage and the fourth voltage are supplied to the horizontal scanning circuit; and
   a main portion of the second conductor and a main portion of a fifth conductor that supplies the third voltage to the horizontal scanning circuit are not isolated from each other, and/or a main portion of a fourth conductor that supplies the fourth voltage to the digital circuit of the signal processing circuit and a main portion of a sixth conductor that supplies the fourth voltage to the horizontal scanning circuit are not isolated from each other.

2. The photoelectric conversion apparatus according to claim 1, wherein the main portions of the first and second conductors that are isolated from each other are arranged on a same wiring layer.

3. The photoelectric conversion apparatus according to claim 1, wherein the main portions of the first and second conductors that are isolated from each other are arranged on different wiring layers.

4. The photoelectric conversion apparatus according to claim 1, wherein common impedance of the first and second conductors that are isolated from each other is equal to or less than $1\Omega$.

5. The photoelectric conversion apparatus according to claim 1, wherein the first voltage and the third voltage are equal to each other, and the second voltage and the fourth voltage are equal to each other.

6. The photoelectric conversion apparatus according to claim 5, wherein the first and second conductors that are isolated from each other are electrically connected to a same input pad.

7. The photoelectric conversion apparatus according to claim 1, wherein:
   the plurality of pixels is arranged in a matrix manner; and
   the vertical scanning circuit simultaneously supplies reset pulses for resetting signals stored in the respective pixels to a plurality of pixels included in a plurality of pixel rows.

8. The photoelectric conversion apparatus according to claim 7, wherein the reset pulses are simultaneously supplied to all pixels of a reading area.

9. The photoelectric conversion apparatus according to claim 1, wherein:
   the plurality of pixels is arranged in a matrix manner;
   each pixel includes a photoelectric conversion element, a pixel amplification unit, and a transfer unit configured to transfer charges generated at the photoelectric conversion element to an input node of the pixel amplification unit; and
   the vertical scanning circuit simultaneously supplies transfer pulses for conducting the transfer unit to transfer units of the plurality of pixels included in the plurality of pixel rows.

10. The photoelectric conversion apparatus according to claim 9, wherein the transfer pulses are simultaneously supplied to all the pixels of a reading area.

11. The photoelectric conversion apparatus according to claim 1, wherein the signals processed by the signal processing unit is read to the outside at a frequency of 70 MHz or higher.

12. The photoelectric conversion apparatus according to claim 1, wherein a main portion of a third conductor that supplies the second voltage to the digital circuit of the vertical scanning circuit and a main portion of a fourth conductor that supplies the fourth voltage to the signal processing unit, wherein the main portion of the third conductor and the main portion of the fourth conductor are isolated from each other.

13. A photoelectric conversion apparatus arranged on one substrate thereof, comprising:
a plurality of pixels;
a plurality of A/D conversion circuits configured to convert analog signals received from the pixels into digital signals;
a signal processing unit that includes a digital circuit configured to sequentially receive the digital signals from the plurality of A/D conversion circuits and execute signal processing; and
a horizontal scanning circuit configured to sequentially output the digital signals converted by the A/D conversion circuit to the signal processing unit,
wherein:
a first voltage and a second voltage, different in value from the first voltage, are supplied to the A/D conversion circuit, and a third voltage and a fourth voltage, different in value from the third voltage, are supplied to the digital circuit of the signal processing unit;
a main portion of a first conductor that supplies the first voltage to the A/D conversion circuit and a main portion of a second conductor that supplies the third voltage to the signal processing unit, wherein the main portion of the first conductor and the main portion of the second conductor are isolated from each other;
the third voltage and the fourth voltage are supplied to the horizontal scanning circuit; and
a main portion of the second conductor and a main portion of a fifth conductor that supplies the third voltage to the horizontal scanning circuit are not isolated from each other, and/or a main portion of a fourth conductor that supplies the fourth voltage to the digital circuit of the signal processing circuit and a main portion of a sixth conductor that supplies the fourth voltage to the horizontal scanning circuit are not isolated from each other.

14. The photoelectric conversion apparatus according to claim 13, wherein each A/D conversion circuit includes:
a first memory configured to store an A/D converted digital signal;
a second memory configured to receive data from the first memory and output the data to the signal processing unit; and
an initialization unit configured to simultaneously set initial values for each first memory.

15. The photoelectric conversion apparatus according to claim 14, wherein the initial value set for the first memory is a value equal to or greater than a full-scale of the A/D conversion circuit.

16. The photoelectric conversion apparatus according to claim 13, wherein a main portion of a third conductor that supplies the second voltage to the A/D conversion unit and a main portion of a fourth conductor that supplies the fourth voltage to the digital circuit of the signal processing unit, wherein the main portion of the third conductor and the main portion of the fourth conductor are isolated from each other.

17. The photoelectric conversion apparatus according to claim 13, wherein the main portions of the first and second conductors that are isolated from each other are arranged on a same wiring layer.

18. The photoelectric conversion apparatus according to claim 13, wherein the main portions of the first and second conductors that are isolated from each other are arranged on different wiring layers.

19. The photoelectric conversion apparatus according to claim 13, wherein common impedance of the first and second conductors that are isolated from each other is equal to or less than 1Ω.

20. The photoelectric conversion apparatus according to claim 13, wherein the first voltage and the third voltage are equal to each other, and the second voltage and the fourth voltage are equal to each other.

21. The photoelectric conversion apparatus according to claim 20, wherein the first and second conductors that are isolated from each other are electrically connected to a same input pad.

22. The photoelectric conversion apparatus according to claim 13, wherein the signals processed at the signal processing unit is read to an outside at a frequency of 70 MHz or higher.

23. A photoelectric conversion apparatus arranged on one semiconductor substrate thereof, comprising:
a plurality of pixels;
a vertical scanning circuit that includes a digital circuit configured to supply a driving signal to the plurality of pixels;
a plurality of A/D conversion circuits configured to convert analog signals received from the pixels into digital signals;
a signal processing unit that includes a digital circuit configured to sequentially receive the digital signals from the plurality of A/D conversion circuits and execute signal processing;
a horizontal scanning circuit that includes a digital circuit configured to sequentially output the digital signals converted by the A/D conversion circuit to the signal processing unit;
a first conductor pattern for supplying a first voltage to the digital circuit of the vertical scanning circuit; and
a second conductor pattern for supplying a third voltage to the digital circuit of the signal processing unit,
wherein:
the first voltage and a second voltage, different in value from the first voltage, are supplied to the digital circuit of the vertical scanning circuit;
the third voltage and a fourth voltage, different in value from the third voltage, are supplied to the digital circuit of the signal processing unit;
60% or more of a distance from a pad to the digital circuit of the vertical scanning circuit in the first conductor pattern, and 60% or more of a distance from the pad to the digital circuit of the signal processing unit in the second conductor pattern are isolated from each other;
the third voltage and the fourth voltage are supplied to the horizontal scanning circuit; and
a portion other than the 60% of the distance from the pad to the digital circuit of the signal processing unit in the second conductor pattern, and a portion less than 60% of a distance from the pad to the digital circuit of the horizontal scanning circuit in a fifth conductor pattern that supplies the third voltage to the horizontal scanning circuit are not isolated from each other, and/or
a portion less than 60% of a distance from the pad to the digital circuit of the signal processing unit in a fourth conductor pattern that supplies the fourth voltage to the digital circuit of the signal processing circuit, and a portion less than 60% of a distance from the pad to the digital circuit of the horizontal scanning circuit in a sixth conductor pattern that supplies the fourth voltage to the horizontal scanning circuit are not isolated from each other.

24. A photoelectric conversion apparatus arranged on one substrate thereof, comprising:
a plurality of pixels;

a plurality of A/D conversion circuits configured to convert analog signals received from the pixels into digital signals; and a signal processing unit that includes a digital circuit configured to sequentially receive the digital signals from the plurality of A/D conversion circuits and execute signal processing;

a horizontal scanning circuit that includes a digital circuit configured to sequentially output the digital signals converted by the A/D conversion circuit to the signal processing unit;

a first conductor pattern that supplies a first voltage to the A/D conversion circuit; and a second conductor pattern that supplies a third voltage to the signal processing unit, wherein:

the first voltage and a second voltage, different in value from the first voltage, are supplied to the A/D conversion circuit, the third voltage and a fourth voltage, different in value from the third voltage, are supplied to the digital circuit of the signal processing unit;

60% or more of a distance from a pad to the digital circuit of the vertical scanning circuit in the first conductor pattern, and 60% or more of a distance from the pad to the digital circuit of the signal processing unit in the second conductor pattern are isolated from each other;

the third voltage and the fourth voltage are supplied to the horizontal scanning circuit; and a portion other than the 60% of the distance from the pad to the digital circuit of the signal processing unit in the second conductor pattern, and a portion less than 60% of a distance from the pad to the digital circuit of the horizontal scanning circuit in a fifth conductor pattern that supplies the third voltage to the horizontal scanning circuit are not isolated from each other, and/or a portion less than 60% of a distance from the pad to the digital circuit of the signal processing unit in a fourth conductor pattern that supplies the fourth voltage to the digital circuit of the signal processing circuit, and a portion less than 60% of a distance from the pad to the digital circuit of the horizontal scanning circuit in a sixth conductor pattern that supplies the fourth voltage to the horizontal scanning circuit are not isolated from each other.

* * * * *